United States Patent [19]

Kaufman

[11] Patent Number: 4,498,120
[45] Date of Patent: Feb. 5, 1985

[54] ELECTRICAL SUB-ASSEMBLY HAVING A LEAD FRAME TO BE COMPRESSED BETWEEN A CIRCUIT BOARD AND HEAT SINK

[76] Inventor: Lance R. Kaufman, 131 White Oak Way, Mequon, Wis. 53092

[21] Appl. No.: 571,637

[22] Filed: Jan. 17, 1984

Related U.S. Application Data

[63] Continuation of Ser. No. 353,175, Mar. 1, 1982, abandoned.

[51] Int. Cl.³ .............................................. H05K 7/20
[52] U.S. Cl. ................... 361/386; 361/412; 174/16 HS
[58] Field of Search ............... 361/386, 387, 388, 389, 361/400, 403, 404, 405, 418, 421, 412, 395; 357/79, 81; 174/16 HS; 165/185, 80 A, 80 B, 80 C, 80 D

[56] References Cited

U.S. PATENT DOCUMENTS

| | | | |
|---|---|---|---|
| 3,405,324 | 10/1968 | Alexander | 361/405 |
| 3,501,598 | 3/1970 | Lis | 361/405 |
| 3,801,728 | 4/1974 | Gallo, Jr. | 361/388 |
| 3,836,704 | 9/1974 | Coules | 361/412 |
| 3,911,327 | 10/1975 | Murari | 361/386 |
| 4,069,497 | 1/1978 | Steidlitz | 361/386 |
| 4,204,248 | 5/1980 | Proffit | 357/81 |
| 4,218,724 | 8/1980 | Kaufman | |
| 4,250,481 | 2/1981 | Kaufman | |
| 4,257,091 | 3/1981 | Kaufman | |
| 4,266,140 | 5/1981 | Kaufman | |
| 4,349,861 | 9/1982 | Zizza | 361/399 |

OTHER PUBLICATIONS

Power Hybrid Module, IBM Tech. Discl. Bull., Liu, vol. 16, No. 11, Apr. 1974, p. 3827.
External Module Heat Sink, IBM Tech. Discl. Bull., Cunavelis, vol. 14, No. 1, Jun. 1971, p. 182.

*Primary Examiner*—G. P. Tolin
*Attorney, Agent, or Firm*—Andrus, Sceales, Starke & Sawall

[57] ABSTRACT

An electrical sub-assembly (11) includes an electrically insulating heat conducting substrate (12) and an interconnected series of spaced lead frame elements (15) which are sandwiched between a printed circuit board (37) and a heat sink (35). A clamp (43) is operatively connected to the printed circuit board (37) and the heat sink (35) to apply clamping pressure through the series of lead frame elements (15) to provide intimate engagement between the substrate (12) and the heat sink (35) to enhance the heat transfer from one or more circuits (i.e. 16, 25, 26, 27) through the substrate (12) to the heat sink (35).

3 Claims, 3 Drawing Figures

ELECTRICAL SUB-ASSEMBLY HAVING A LEAD FRAME TO BE COMPRESSED BETWEEN A CIRCUIT BOARD AND HEAT SINK

This is a continuation of application Ser. No. 353,175 filed Mar. 1, 1982, now abandoned.

BACKGROUND OF THE INVENTION

This invention relates to an electrical sub-assembly having a lead frame to be compressed between a circuit board and a heat sink to enhance heat transfer from an inter-connecting substrate to the heat sink.

Lead frames and thick film circuits have been advantageously employed with respect to heat conducting, electrically insulating substrates. In many constructions, a lead frame sub-assembly is placed upon solder paste or conductive epoxy located on the insulating substrate. The intervening solder or epoxy is reflowed by heat or other means to permanently bond portions of the lead frame sub-assembly to the substrate. In addition, other discrete components may be placed upon certain portions of the lead frame sub-assembly or upon portions of the thick film circuit and permanently bonded thereto by reflowing the interconnected solder paste or conductive epoxy. Portions of the lead frame sub-assembly may be detached so that a sub-assembly is formed which includes the insulating substrate and a series of lead frame portions which are each bonded to the substrate by the reflowed solder or conductive epoxy. Portions of the lead frame may be bent normal to the substrate to form electrical terminal connections which may function to conduct large amounts of current to operating circuits which may include various components such as high power conducting semi-conductor devices. Such construction is particularly useful in high power energy conversions such as employed with electric motor drives or the like. One highly desirable construction is shown in the U.S. Pat. No. 3,958,075 entitled "High Power Thick Film Circuit With Overlapping Lead Frame", which issued on May 18, 1976 to Lance R. Kaufman.

In one desirable construction, one or more lead frame connectors are bonded to a pair of spaced substrates lying in the same plane with the lead frame connectors thereafter bent into U-shaped configurations so that one portion of each lead frame connector and attached substrate is spaced in parallel with another portion of the lead frame connector and attached second substrate. Such construction has been found to be highly desirable in positioning a photon emitting control element in spaced relationship with a photon activated switch operating in a solid state power control device, such as shown in the U.S. Pat. No. 4,156,148 entitled "Photocoupling Structure For A Solid State Power Control Device", which issued on May 22, 1979 to Lance R. Kaufman.

Sub-assemblies including lead frames attached to an insulating substrate have been advantageously placed within an insulating housing. Such housings have included a cavity surrounded by one or more edges which engage the substrate to limit its depth of entry into the cavity. The use of such limiting edge avoids pressure being placed upon the circuit elements to permit thermal contraction and expansion of the circuit elements in response to heat generated by the conducted electrical energy. Such thermal expansion and contraction is particularly desirable in high power conducting solid state devices such as thyristors or the like. One highly desirable device is shown in U.S. application Ser. No. 834,601 entitled "Power Switching Device Having Improved Heat Dissipation Means", which was filed on Sept. 19, 1977 by Lance R. Kaufman.

Plural electrically insulating substrates each containing respective interconnected lead frame connectors have been advantageously employed within a compact circuit package. Under certain conditions, selected lead frame connectors which are mounted to one substrate engage selected lead frame connectors mounted to another substrate at or within housing apertures providing external electrical connection to such lead frame connectors. One desirable construction is shown in U.S. Pat. No. 4,218,724 entitled "Compact Circuit Package Having Improved Circuit connectors", which issued on Aug. 19, 1980 to Lance R. Kaufman.

Compact circuit packages are capable of retaining a wide variety of circuit constructions mounted upon one or more of the substrates. By way of example, an electrical power converting thyristor firing circuit could be used, such as disclosed in U.S. Pat. No. 4,257,091 entitled "Electrical Power Converter Thyristor Firing Circuit Having Noise Immunity", which issued on Mar. 17, 1981 to Lance R. Kaufman. Optically couplable circuit elements could be used as shown in U.S. Pat. No. 4,266,140 entitled "Positioning Means For Optically Couplable Circuit Elements", which issued on May 5, 1981 to Lance R. Kaufman. One or more terminals could be used for the main input and output power connections such as disclosed in U.S. Pat. No. 4,215,235 entitled "Lead Frame Terminal", which issued on July 29, 1980 to Lance R. Kaufman. One or more variable resistance devices could be used such as disclosed in U.S. Pat. No. 4,250,481 entitled "Variable Resistance Device For Thick Film Circuitry", which issued on Feb. 10, 1981 to Lance R. Kaufman. One or more dual resistor elements could be used such as disclosed in U.S. Pat. No. 4,196,411 entitled "Dual Resistor Element", which issued on Apr. 1, 1980 to Lance R. Kaufman. Numerous other circuits and elements could also be utilized.

SUMMARY OF THE INVENTION

An electrical sub-assembly is clamped between a printed circuit board and a heat sink. The sub-assembly includes an electrically insulating, heat conducting substrate which conducts heat from a heat generating electrical circuit at a first substrate side to an oppositely disposed side to be dissipated at an attached heat sink. A lead frame is electrically connected to the heat generating circuit and includes a force transmitting portion to be connected to the circuit board to receive and transmit compressive forces from the circuit board to the substrate for compressing the substrate second side into intimate engagement with the heat sink to enhance heat transfer from the electrical circuit to the heat sink.

The compressive force is transmitted through a series of lead frame elements for providing a series of pressure points to supply uniform clamping pressure along the substrate second side. Such series of lead frame elements include a first portion providing a substantial area which is permanently affixed to the substrate first side and a second integral portion which extends substantially normal to the lead frame first portion to be connected to the circuit board. The second integral portion includes a base having a first predetermined width and an extended portion of a second predetermined width to provide an intervening ledge to be connected to a circuit board to receive and transmit the compressive force from the circuit board to the substrate.

A clamp may advantageously be connected to the circuit board and the heat sink to exert substantial clamping pressures to the series of lead frame elements.

The electrical sub-assembly provides a unique lead frame construction having multiple functions which include the transmission of substantial compressive forces to enhance heat transfer from a heat generating circuit through an electrically insulating substrate to an oppositely disposed heat sink while further providing a circuit conduction path to or from the circuit assembly and the printed circuit board. Further, the use of a series of lead frame elements provides a series of spaced pressure points for uniform distribution of compressive clamping forces which advantageously avoids direct clamping upon discrete circuit elements such as thyristors or the like.

DETAILED DESCRIPTION OF THE PREFERRED EMBODIMENT

Figure 1:
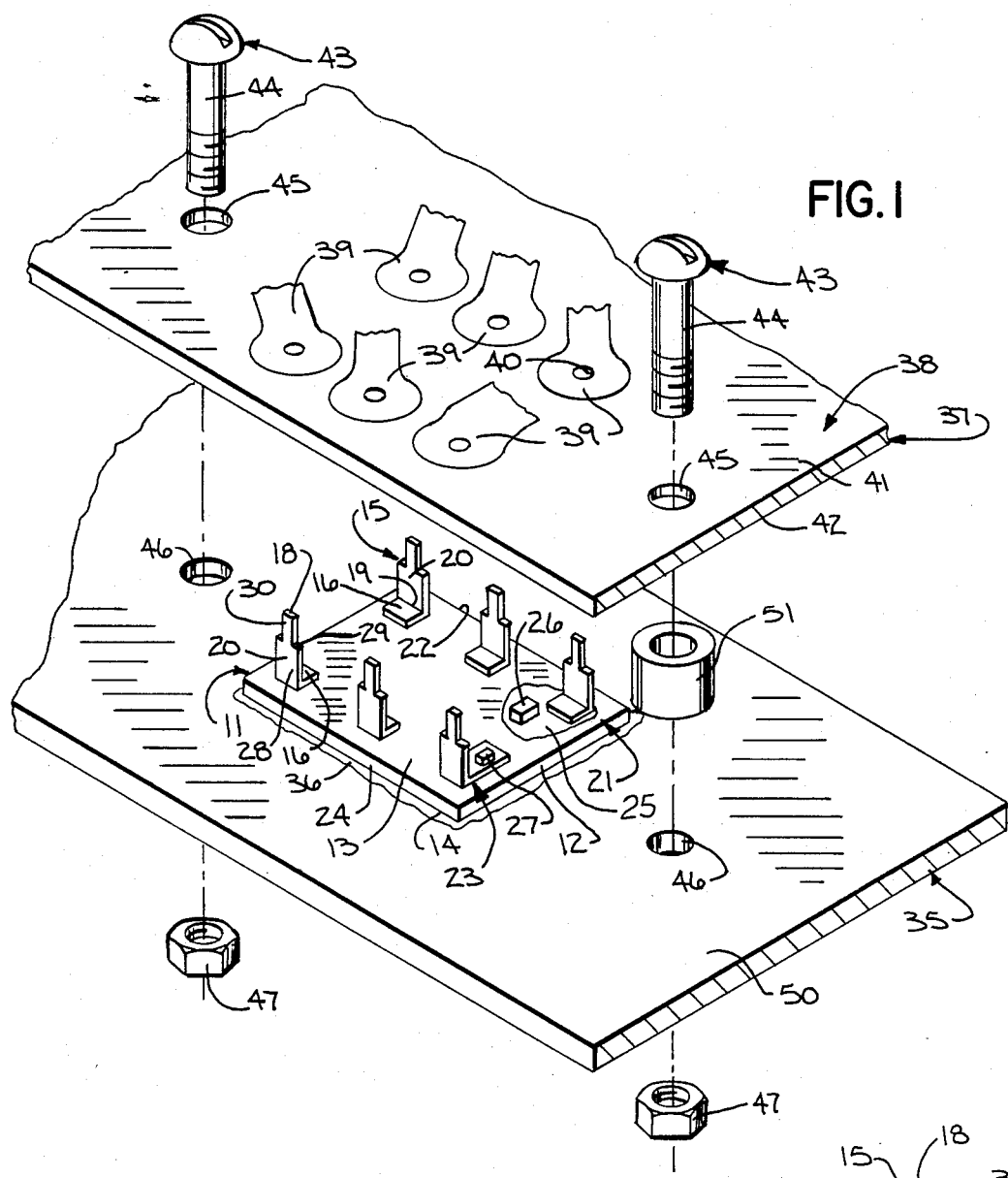
FIG. 1 is a perspective view of an electrical sub-assembly sandwiched between a heat sink and a printed circuit board with certain parts shown in an exploded view.
Figure 2:
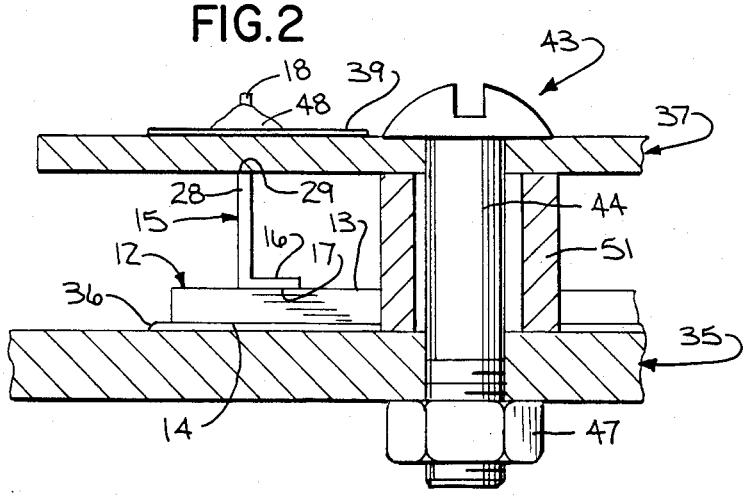
FIG. 2 is a sectional view of a portion of the assembly of FIG. 1.
Figure 3:
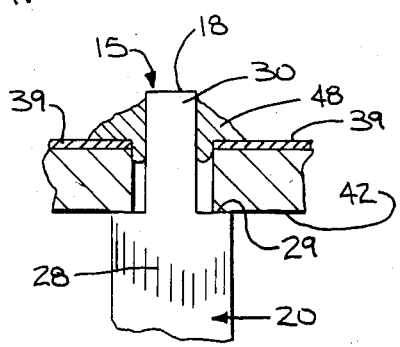
FIG. 3 is a sectional view of a portion of the assembly of FIGS. 1 and 2 illustrating a connection between a lead frame extension and a portion of the printed circuit board.

An electrical sub-assembly 11 includes an electrically insulating heat conducting substrate 12 having a pair of oppositely disposed substantially planar sides 13 and 14.

During assembly, a composite lead frame includes an outer frame portion integrally joined to a series of inwardly directed lead frame elements. Each of the elements 15 include lead frame portions 16 having a substantially planar surface 17 which is bonded to surface 13 of substrate 12 through intervening solder, metalization, epoxy or other suitable material (not shown).

After the series of lead frame portions 16 have been bonded to substrate 12, such as by a conventional metal reflowing process, each lead frame element 15 is severed at an outer portion 18 from the peripheral outer frame portion and thereafter bent at and along a bending line 19 to provide an outwardly directed portion 20 which is substantially normal to lead frame portion 16 and surface 13 of substrate 12.

As illustrated in FIG. 1, a first series 21 of spaced normally directed lead frame extensions 20 are located adjacent to a first side 22 of substrate 12 while a second series 23 of spaced normally directed lead frame extensions 20 are located adjacent to a second side 24 oppositely spaced from side 22.

In certain constructions, a thick film circuit 25 may be utilized to inter-connect a lead frame portion 16 to side 13 of substrate 12. Such thick film circuits 25 may be extended over the surface 13 of substrate 12 to be connected to other circuits, such as to a diode 26 which operates to selectively conduct current and thereby generate heat along the surface 13 of substrate 12. In other circuit constructions a heat generating component, such as a silicon controlled rectifier (SCR) 27, is bonded to a lead frame extension 16, such as through an intervening layer of metalization, solder or the like, which likewise functions in response to current conduction to generate heat at and along surface 13 of substrate 12.

The normally directed extensions 20 of each of the lead frame element 15 include a first portion 28 connected through an intervening ledge 29 to an outer extended portion 30 which has a substantially less diameter than portion 28.

A sub-assembly 11 therefore includes the electrically insulating heat conducting substrate 12 and the attached circuit assembly including the series of spaced lead frame elements 15 and interconnected circuit elements, such as for example and without limitation, thick film circuits 25 and electrically conducting components such as diode 26 and SCR 27. Such circuits can be utilized in a wide variety of circuit constructions.

Where large currents are utilized by the sub-assembly 11, it is desirable to clamp the side 14 of substrate 12 to a heat sink 35 through an intervening layer of heat conductive silicon grease 36.

A printed circuit board 37 includes an electrically insulating board 38 containing a series of printed circuits 39. A number of openings 40 are located in board 38 and are positioned to receive the outer portions 30 of the lead frame elements 15. In one construction, the printed circuits 39 are located upon a first side 41 of board 38 while a second oppositely disposed side 42 engages the series of ledges 29 provided by the lead frame elements 15.

A clamp 43 is operatively connected to the printed circuit board 37 and the heat sink 35 for applying clamping pressure through the series of lead frame elements 15. Specifically, a series of bolts 44 are located within aligned openings 45 and 46 in the printed circuit board 37 and heat sink 35 and applying clamping pressure through the tightening of associated nuts 47.

If desirable, the upper portion 30 of the lead frame elements 15 may be electrically connected to the film circuits 39 by a circuit connection, such as solder 48. In any event, the surface 42 of the printed circuit board 37 applies a compressive force upon the series of ledges 29 which is transmitted through the lead frame elements 15 to the upper surface 13 of substrate 12. In such manner, compressive force is transmitted at a series of spaced points along the upper surface 13 of substrate 12 which, in turn, transmits substantially uniform clamping pressure along the oppositely disposed surface 14 of substrate 12. Such substantial uniform clamping pressure is therefore provided to compress the substrate 12 into intimate engagement with the substantially planar heat sink surface 50.

The substantially distributed compressive forces exerted through the lead frame elements 15 enhance the heat transfer from the first side 13 of substrate 12 to the oppositely disposed heat sink 35. The construction is highly advantageous because substantial amounts of heat is conducted away from the circuit elements located upon side 13 of substrate 12 which permits increased current conduction by lowering operating temperatures thereat.

If desirable, optional spacers 51 can be inter-connected at points adjacent to the bolts 44 which may be desirable when such bolts are spaced by a substantial distance from the lead frame elements 15. Such spacers 51 may prevent the heat sink 35 and printed circuit board 37 from bowing in response to substantial pressures thereat.

Various modes of carrying out the invention are contemplated as being within the scope of the following claims which particularly point out and distinctly claim the subject matter which is regarded as the invention.

I claim:

1. An electrical assembly comprising:
   a heat sink;
   an electrically insulating and heat conducting substrate mounted on said heat sink;
   electrical means mounted on said substrate and generating heat in response to the conduction of current through said electrical means;
   a printed circuit board;
   mounting means compressively clamping said printed circuit board to said heat sink in spaced relation above said substrate; and
   lead frame means operatively connected to said electrical means and extending between said printed circuit board and said substrate, said lead frame means
   (a) spacing said printed circuit board above said substrate,
   (b) receiving and transmitting compressive clamping force between said printed circuit board and said substrate and compressively forcing said substrate into intimate engagement with said heat sink to enhance heat transfer from said electrical means to said heat sink, and
   (c) conducting current to said electrical means.

2. The invention according to claim 1 wherein said mounting means is laterally offset and spaced from said electrical means on said substrate, and wherein said lead frame means comprises a plurality of lead frame extensions providing a series of pressure points against said substrate laterally inwardly of said mounting means and providing uniform clamping pressure and intimate engagement of said substrate and said heat sink in a compression at a plurality of distributed points enhancing heat transfer from said electrical means to said heat sink.

3. An electrical assembly comprising:
   a heat sink;
   a rigid ceramic substrate of given horizontal periphery mounted on said heat sink;
   electrical means mounted on said ceramic substrate and generating heat in response to the conduction of current through said electrical means;
   a printed circuit board;
   mounting means horizontally outside of said given periphery of said ceramic substrate and compressively vertically clamping said printed circuit board to said heat sink in vertically spaced relation above said ceramic substrate; and
   lead frame means operatively connected to said electrical means and extending rigidly and nonflexurally between said printed circuit board and said substrate at a plurality of points within said given periphery and substantially adjacent said electrical means, said lead frame means
   (a) spacing said printed circuit board above said ceramic substrate,
   (b) receiving and transmitting compressive clamping force between said printed circuit board and said ceramic substrate and compressively forcing said ceramic substrate into intimate engagement with said heat sink to enhance heat transfer from said electrical means to said heat sink, and
   (c) conducting current to said electrical means.

* * * * *